(12) United States Patent
Huang et al.

(10) Patent No.: US 9,356,124 B2
(45) Date of Patent: May 31, 2016

(54) METHOD FOR FABRICATING MULTI-GATE STRUCTURE DEVICE WITH SOURCE AND DRAIN HAVING QUASI-SOI STRUCTURE

(71) Applicant: Peking University, Beijing (CN)

(72) Inventors: Ru Huang, Beijing (CN); Jiewen Fan, Beijing (CN); Jia Li, Beijing (CN); Xiaoyan Xu, Beijing (CN); Ming Li, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/764,155

(22) PCT Filed: Sep. 30, 2013

(86) PCT No.: PCT/CN2013/084743
§ 371 (c)(1),
(2) Date: Nov. 13, 2015

(87) PCT Pub. No.: WO2014/153942
PCT Pub. Date: Oct. 2, 2014

(65) Prior Publication Data
US 2016/0064529 A1 Mar. 3, 2016

(30) Foreign Application Priority Data
Mar. 28, 2013 (CN) .......................... 2013 1 0103543

(51) Int. Cl.
*H01L 21/00* (2006.01)
*H01L 29/66* (2006.01)
(Continued)

(52) U.S. Cl.
CPC ...... *H01L 29/66795* (2013.01); *H01L 21/0217* (2013.01); *H01L 21/0228* (2013.01);
(Continued)

(58) Field of Classification Search
CPC ................... H01L 29/66795; H01L 21/02164; H01L 21/0217
See application file for complete search history.

(56) References Cited

U.S. PATENT DOCUMENTS 8,389,367 B2 * 3/2013 Zhou ................. H01L 29/66795
257/E21.442
8,673,722 B2 * 3/2014 Huang ................. H01L 29/0653
257/288

(Continued)

FOREIGN PATENT DOCUMENTS

CN         1303656 C  *  3/2007
CN       101060136 A     10/2007

(Continued)

OTHER PUBLICATIONS

International Search Report in related PCT patent application No. PCT/CN2013/084743, dated Jan. 9, 2014, as well as English-language translation thereof (8 pgs.).

*Primary Examiner* — Laura Menz
(74) *Attorney, Agent, or Firm* — Knobbe Martens Olson & Bear LLP

(57) ABSTRACT

A method for fabricating a multi-gate structure device with a source and a drain having a quasi-SOI structure, comprising forming an active region in a shape of a fin bar, forming an oxide isolation layer for shallow trench isolation (STI), forming a polysilicon dummy gate, forming source and drain extension regions, forming the source and the drain with the quasi-SOI structure, and forming a high-K metal gate. Solution(s) consistent with the present innovations may be achieved by using a process method compatible with the conventional bulk silicon CMOS processes and can be easily integrated into the process flow. Moreover, innovations here may provide a small leakage current even in a case of having a short channel length, thereby reducing the power consumption of the device.

20 Claims, 8 Drawing Sheets

(51) Int. Cl.
*H01L 21/02* (2006.01)
*H01L 21/311* (2006.01)
*H01L 21/762* (2006.01)
*H01L 21/3105* (2006.01)
*H01L 21/265* (2006.01)
*H01L 21/324* (2006.01)
*H01L 21/3065* (2006.01)
*H01L 29/08* (2006.01)
*H01L 21/28* (2006.01)
*H01L 21/285* (2006.01)
*H01L 29/51* (2006.01)
*H01L 21/321* (2006.01)

(52) U.S. Cl.
CPC .... *H01L21/02164* (2013.01); *H01L 21/02181* (2013.01); *H01L 21/26513* (2013.01); *H01L 21/2855* (2013.01); *H01L 21/28088* (2013.01); *H01L 21/28556* (2013.01); *H01L 21/3065* (2013.01); *H01L 21/31055* (2013.01); *H01L 21/31116* (2013.01); *H01L 21/324* (2013.01); *H01L 21/3212* (2013.01); *H01L 21/76224* (2013.01); *H01L 29/0847* (2013.01); *H01L 29/513* (2013.01); *H01L 29/517* (2013.01); *H01L 29/66545* (2013.01); *H01L 29/66575* (2013.01)

(56) References Cited

U.S. PATENT DOCUMENTS

| | | | |
|---|---|---|---|
| 8,710,566 B2 * | 4/2014 | Ellis | H01L 27/108 257/300 |
| 8,778,744 B2 * | 7/2014 | Zhou | H01L 29/66795 257/E21.619 |
| 8,815,691 B2 * | 8/2014 | Colinge | H01L 29/785 257/E29.262 |
| 9,064,730 B2 * | 6/2015 | Ellis | H01L 27/108 |
| 9,257,327 B2 * | 2/2016 | Rodder | H01L 21/76243 |
| 9,263,535 B2 * | 2/2016 | Colinge | H01L 29/785 |
| 9,263,587 B1 * | 2/2016 | Jacob | H01L 29/66803 |
| 2008/0111194 A1 * | 5/2008 | Kawakita | H01L 29/7851 257/365 |
| 2012/0220093 A1 | 8/2012 | Zhou et al. | |
| 2013/0043515 A1 * | 2/2013 | Huang | H01L 29/0653 257/288 |
| 2014/0175561 A1 * | 6/2014 | Colinge | H01L 29/785 257/401 |
| 2015/0021672 A1 * | 1/2015 | Chuang | H01L 21/28088 257/288 |
| 2015/0024561 A1 | 1/2015 | Li et al. | |
| 2015/0048454 A1 * | 2/2015 | Colinge | H01L 29/785 257/347 |

FOREIGN PATENT DOCUMENTS

| | | | | |
|---|---|---|---|---|
| CN | 102646599 A | | 8/2012 | |
| CN | 102651321 A | | 8/2012 | |
| CN | 103151269 A | * | 6/2013 | ........ H01L 29/66545 |
| CN | WO 2014153942 A1 | * | 10/2014 | ........ H01L 29/66545 |
| CN | WO 2015089951 A1 | * | 6/2015 | ........ H01L 29/66545 |
| CN | WO 2015089952 A1 | * | 6/2015 | ........ H01L 29/66545 |
| CN | 103151269 B | * | 8/2015 | ........ H01L 29/66545 |
| WO | WO 2012113170 A1 | | 8/2012 | |
| WO | WO 2013152535 A1 | | 10/2013 | |

* cited by examiner

Silicon Oxide    Silicon Nitride    Silicon

Polysilicon    Al

METHOD FOR FABRICATING MULTI-GATE STRUCTURE DEVICE WITH SOURCE AND DRAIN HAVING QUASI-SOI STRUCTURE

CROSS-REFERENCE TO RELATED APPLICATION(S)

This application This application is a U.S. National Stage Application of International Application No. PCT/CN2013/084743, filed Sep. 30, 2013, published as WO2014/153942 A1, which claims priority from Chinese Patent Application No. CN201310103543.1, filed Mar. 28, 2013, published as CN103151269A, which are incorporated herein by reference in entirety.

FIELD

The present invention relates to a method for fabricating a multi-gate structure device with a source and a drain having a quasi-SOI structure, which belongs to a technical field of the fabrication of ultra large scaled integrated circuits.

BACKGROUND

Nowadays, the semiconductor manufacturing industry has rapidly developed under the Moore's law. It is required to increasingly elevate the performance and integration density of the integrated circuits and to decrease the power consumption as much as possible. To fabricate a short channel device with high performance and low power consumption will be a focus of the future semiconductor manufacturing industry. After entering into a technology node of 22 nm, the conventional planar field effect transistors may have increased leakage current due to the more and more severed short channel effect, and thereby cannot meet the development of semiconductor fabrication. In order to overcome the above issues, a multi-gate structure device has gained wide concerns, since the multi-gate structure device has excellent gate-control capability and transferring characteristic, and can increase a driving current density in a unit area while suppressing the short channel effect.

Although the multi-gate structure device has outstanding gate-control capability due to its special geometric construction, it may still have a large leakage current when its channel size shrinks to a certain degree, which may seriously affect the power consumption of the device. An SOI substrate can be used to decrease the leakage current. However, since the SOI substrate has a high cost and is distinct from the conventional bulk silicon, it is rarely used in the fabrication of large scale integrated circuits.

SUMMARY

In order to solve the difficulty that the multi-gate structure device, when having a short channel still has a large leakage current, the present invention aims to provide a method for fabricating a multi-gate structure device with a source and a drain having a quasi-SOI structure. A solution of the present invention can be achieved by using a process method compatible with the conventional bulk silicon CMOS process and can be easily integrated into the process flow. Moreover, the solution of the present invention can maintain a small leakage current even in a case of having a short channel length, thereby reducing the power consumption of the device.

Taking a tri-gate structure device as an example (the method of the present invention can be applied to a double-gate device and a tri-gate device), a technical solution of the present invention for fabricating a multi-gate structure device with a source and a drain having a quasi-SOI structure includes the following steps.

a) forming an active region in a shape of a fin bar,
the step of which mainly aims to form a pattern in a fine strip shape (a shape of a fin bar) in a hard mask by using a photolithography process, comprising:
i. depositing a silicon oxide layer (with a thickness of 200 Å) and a silicon nitride layer (with a thickness of 500 Å) on a surface of a silicon wafer to be used as materials of the hard mask;
ii. defining the pattern of the fin bar in a fine strip shape by using a photolithography process;
iii. Transferring the pattern onto the hard mask by using a dry etching process.
iv. Transferring the pattern onto the silicon wafer by using the hard mask and removing a photoresist;

b) forming an oxide isolation layer for STI (shallow trench isolation),
the step of which mainly aims to form an oxide isolation layer for STI around the active region, comprising:
i. depositing a thick silicon oxide layer (1000 Å or more above the fin bar) as a material for STI;
ii. performing a CMP (chemical mechanical polishing) process to the silicon oxide layer until stopping at a surface of the silicon nitride layer, so that the surface of the silicon nitride layer and a surface of the silicon oxide layer are flattened;
iii. removing the silicon nitride layer used as the hard mask by using a wet corrosion process;
iv. etching back the silicon oxide layer in a region of STI by using a dry etching process so as to form STI;
v. performing a well implantation process and a well annealing process;
vi. performing an implantation process and annealing process for inhibiting a substrate parasite transistor from being formed;

c) forming a polysilicon dummy gate,
the step of which mainly aims to reduce a trench width by sacrificing the sidewalls and then forming a dummy polysilicon gate line with an ultra narrow line width by back filling with a polysilicon layer, comprising:
i. forming a silicon oxide layer through a dry oxygen oxidation process to be used as a dummy gate dielectric layer;
ii. depositing a thick (1000 Å or more above the fin bar) polysilicon layer as a gate material layer;
iii. performing a CMP process to flatten the polysilicon layer until stopping at a certain height from the top of the fin bar;
iv. depositing a silicon oxide layer (with a thickness of 300 Å) as a hard mask layer for a gate line;
v. forming a hard mask line and the gate line through a photolithography process and an etching process;

d) forming source and drain extension regions,
the step of which mainly aims to form a source and a drain of the multi-gate structure device, comprising:
i. depositing a very thin (50 Å) silicon oxide layer as an offset material layer;
ii. performing an implantation process and an annealing process for the source and drain extension regions;
iii. depositing a silicon oxide layer (100 Å) and etching back it by using a dry etching process so as to form silicon oxide sidewalls;

e) forming the source and the drain with the quasi-SOI structure, comprising:
  i. etching the silicon wafer in the source and the drain until stopping under a surface of the region of STI;
  ii. depositing a silicon nitride layer (150 Å) and etching back it by using a dry etching process to form silicon nitride sidewalls, which are formed only at outer surfaces of the silicon oxide sidewalls, while the silicon nitride layer within a trench between regions of STI in the source and the drain is completely removed;
  iii. etching the silicon within the trench of the source and the drain regions once again to a certain depth (20-30 nm) by using an anisotropic dry etching process;
  iv. forming a silicon oxide layer in the trench of the source and the drain through a wet oxidation process to be used as an isolation layer in the quasi-SOI structure;
  v. performing a wet corrosion process to remove the silicon nitride sidewalls;
  vi. doping an epitaxial monocrystalline silicon layer in situ to form a highly-doped lifted source and drain;
  vii. performing an implantation process and an annealing process for the source and the drain;
f) forming a high-k ("high-k" refers to a material having a high dielectric constant) metal gate,
  the step of which mainly aims to form the high-k metal gate by removing the dummy gate and the dummy gate dielectric layer and back-filling with a high-k metal gate material layer, comprising:
  i. depositing a silicon oxide layer (4000 Å) as a dielectric layer;
  ii. performing a CMP process to the silicon oxide layer until stopping at a surface of the polysilicon, so that a surface of the silicon oxide layer and the surface of the polysilicon are flattened;
  iii. removing the polysilicon dummy gate through a wet corrosion process;
  iv. removing the dummy gate dielectric layer of silicon oxide through a wet corrosion process;
  v. forming a transition layer of silicon oxide and a high-k gate dielectric layer of $HfO_2$ through an atomic layer deposition process;
  vi. forming a metal work function adjusting layer of TiN through an atomic layer deposition process;
  vii. forming a metal gate material layer of Al through a physical vapor deposition process;
  viii. performing a CMP process to the metal gate material layer of Al until stopping at the surface of the silicon oxide layer, so that the surface of the silicon oxide layer and a surface of Al are flattened;
  ix. forming contact holes by using a photolithography process and an etching process;
  x. forming metal contacts and performing an alloying process.

The present invention has the following technical effects.

The solution of the present invention can be achieved by using a process method compatible with the conventional bulk silicon CMOS process and can be easily integrated into the process flow. Moreover, the solution of the present invention can maintain a small leakage current even in a case of having a short channel length, thereby reducing the power consumption of the device.

DETAILED DESCRIPTION OF THE EMBODIMENTS

Hereinafter, the present invention will be described in detail in conjunction with specific embodiments. A process for fabricating a multi-gate structure device with an ultra short channel according to the present invention will be given. The process will be described by example of a tri-gate structure device, which does not limit the scope of the present invention in any way.

An n-type tri-gate field effect transistor, which has a fin bar with a width of 10 nm, a height of 30 nm and a channel length of 25 nm, is fabricated according to the following steps.

1. A silicon oxide layer of 200 Å is deposited on a silicon substrate through a low pressure chemical vapor deposition process.

2. A silicon nitride layer of 500 Å is deposited on the silicon oxide layer through a low pressure chemical vapor deposition process.

3. A fin bar with a width of 20 nm is defined through a photolithography process.

4. The silicon nitride layer of 500 Å is subjected to an anisotropic dry etching process.

5. The silicon oxide layer of 200 Å is subjected to an anisotropic dry etching process.

Figure 1:
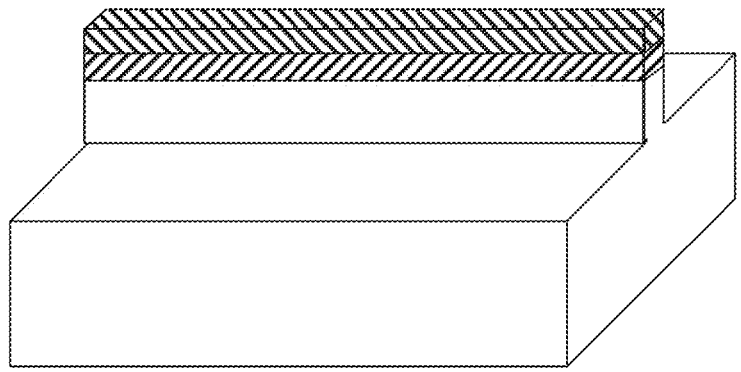
FIG. 1 is a schematic view of a structure of the device after a fin bar is formed.

6. The silicon substrate of 3000 Å is subjected to an anisotropic dry etching process, as shown in FIG. 1.

7. A photoresist is removed.

8. A silicon oxide layer of 5000 Å is deposited on the silicon substrate through a low pressure chemical vapor deposition process.

Figure 2:
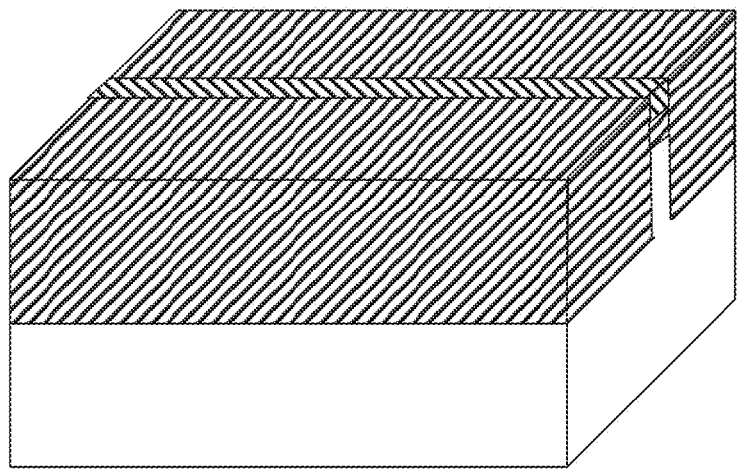
FIG. 2 is a schematic view of a structure of the device after a silicon oxide layer used for isolation is subjected to a CMP process.

9. The silicon oxide layer is flattened through a CMP (chemical mechanical polishing) process until stopping at the silicon nitride layer used as a hard mask, as shown in FIG. 2.

10. The silicon nitride layer of 500 Å is subjected to an isotropic wet corrosion process by using a hot phosphoric acid solution.

Figure 3:
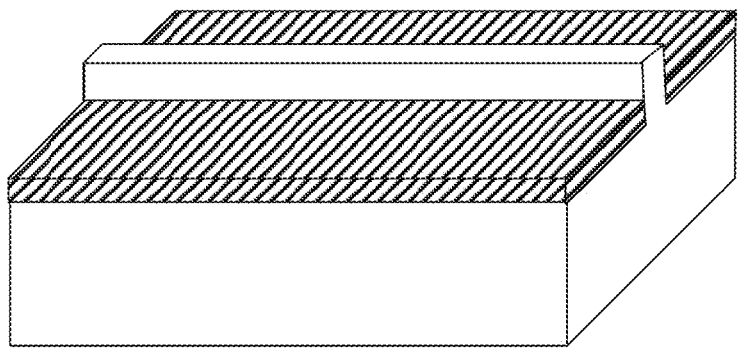
FIG. 3 is a schematic view of a structure of the device after an isolation region and an active region are formed.

11. The silicon oxide of 1000 Å is subjected to an anisotropic dry etching process to expose the silicon substrate of 300 Å, which is used as an active region, as shown in FIG. 3.

12. A P-well implantation with B is performed. The implantation energy is 100 keV; the implantation angle is 0 degree; and the implantation dosage is 1e13 cm$^{-2}$.

13. A P-well implantation with B is performed. The implantation energy is 60 keV; the implantation angle is 0 degree; and the implantation dosage is 1e13 cm$^{-2}$.

14. A P-well implantation with B is performed. The implantation energy is 20 keV; the implantation angle is 0 degree; and the implantation dosage is 1e13 cm$^{-2}$.

15. The well is driven-in and activated. A RTA (rapid thermal annealing) process is performed at a temperature of 1050 degrees for 20 seconds.

16. An implantation with B for suppressing a substrate parasite transistor is performed. The implantation energy is 8 keV; the implantation angle is 0 degree; and the implantation dosage is 1e13 cm$^{-2}$.

17. Impurities implanted for suppressing the substrate parasite transistor. A laser annealing process is performed at a temperature of 1100 degrees for 1 ns.

18. The silicon substrate is subjected to a surface treatment by using an HF solution.

19. A dry oxygen oxidation process is performed to form an oxide layer of 20 Å to be used as a dummy gate dielectric layer.

20. A polysilicon layer of 1000 Å is deposited through a low pressure chemical vapor deposition process to be used as a dummy gate material layer.

21. The polysilicon layer is flattened through a CMP (chemical mechanical polishing) process until stopping at a position of 300 Å above a top of the fin bar.

22. A silicon oxide layer of 300 Å is deposited through a low pressure chemical vapor deposition process to be used as a hard mask material layer for a gate line, 23. The gate line, which has a width of 25 nm, that is, a physical gate length of 25 nm, is defined by a photolithography process.

24. The silicon oxide layer of 300 Å is subjected to an anisotropic dry etching process to form a hard mask line.

Figure 4:
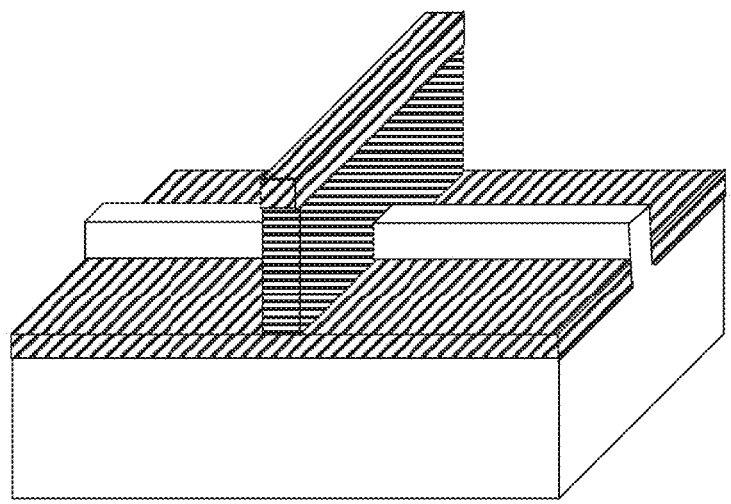
FIG. 4 is a schematic view of a structure of the device after a dummy gate is formed.

25. The polysilicon layer of 3000 Å and the silicon oxide layer of 20 Å are subjected to an anisotropic dry etching process to form a dummy gate, as shown in FIG. 4.

26. A silicon oxide layer of 50 Å is deposited through a low pressure chemical vapor deposition process to be as an offset material layer.

27. An implantation with As is performed for source and drain extension regions. The implantation energy is 5 keV; the implantation angle is 20 degrees; and the implantation dosage is 1e15 cm$^{-2}$. The implantation is performed twice.

28. Impurities in the source and drain extension regions are activated. A laser annealing process is performed at a temperature of 1100 degrees for 1 ns.

29. A silicon oxide layer of 100 Å is deposited through a low pressure chemical vapor deposition process to be as a sidewall material layer.

Figure 5:
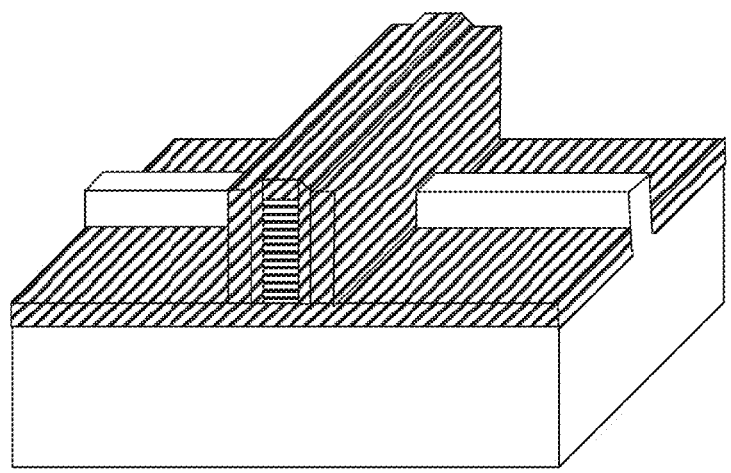
FIG. 5 is a schematic view of a structure of the device after an offset layer and sidewalls are formed.

30. The silicon oxide layer of 150 Å is subjected to an anisotropic dry etching process to form sidewalls and to expose the silicon substrate in the source and the drain, as shown in FIG. 5.

Figure 6:
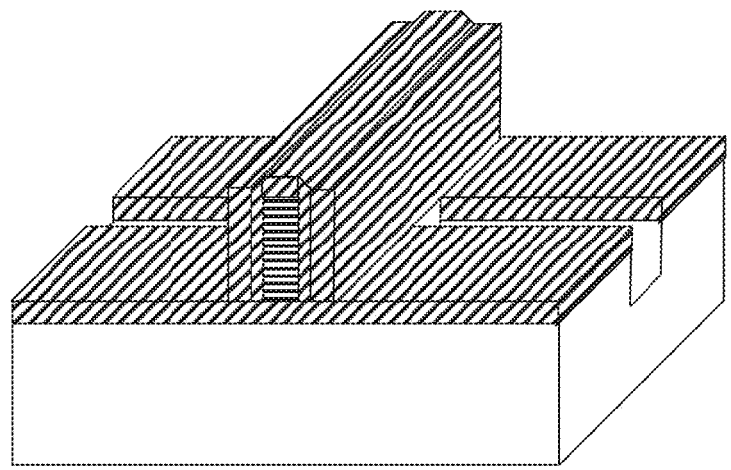
FIG. 6 is a schematic view of a structure of the device after a trench is formed between STI regions in each of a source and a drain.

31. The silicon substrate of 400 Å is subjected to an anisotropic dry etching process to form a trench between STI regions in each of the source and drain, as shown in FIG. 6.

32. A silicon nitride layer of 150 Å is deposited through a low pressure chemical vapor deposition process to be used as a sidewall material layer.

Figure 7:
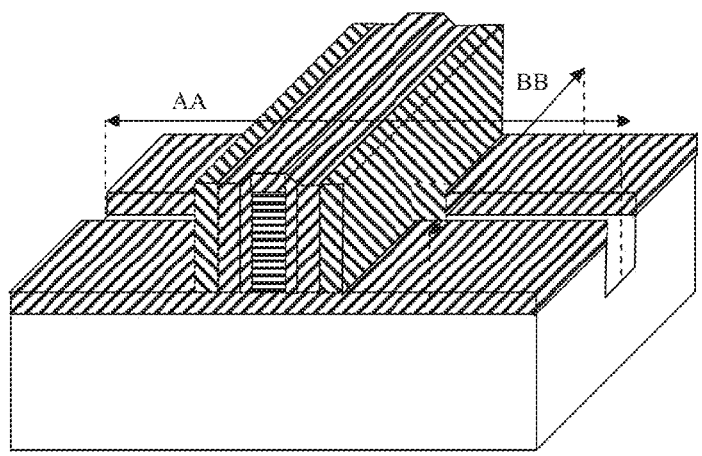
FIG. 7 is a schematic view of a structure of the device after silicon nitride sidewalls are formed.
Figure 8:
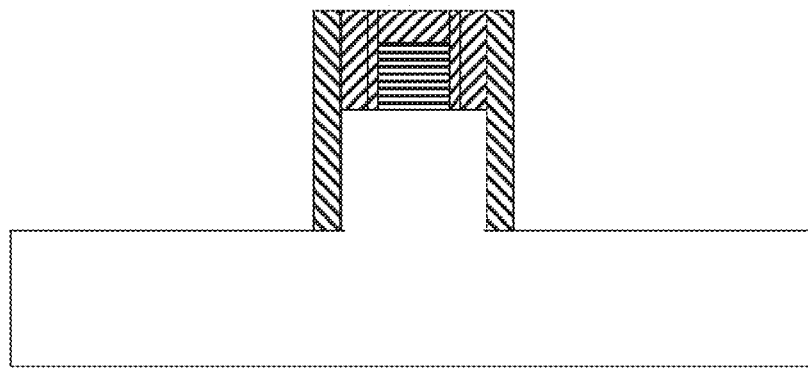
FIG. 8 is a cross-sectional view in an AA direction of the device of FIG. 7.
Figure 9:
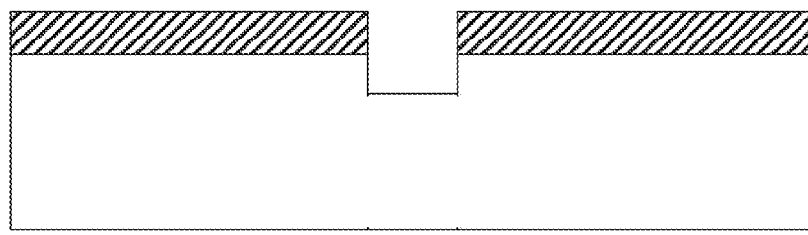
FIG. 9 is a cross-sectional view in a BB direction of the device of FIG. 7.

33. The silicon nitride layer of 250 Å is subjected to an anisotropic dry etching process to form sidewalls and to expose the silicon substrate in the source and drain regions, as shown in FIG. 7, where a cross-sectional view in AA direction is shown in FIG. 8 and a cross-sectional view in BB direction is shown in FIG. 9.

Figure 10:
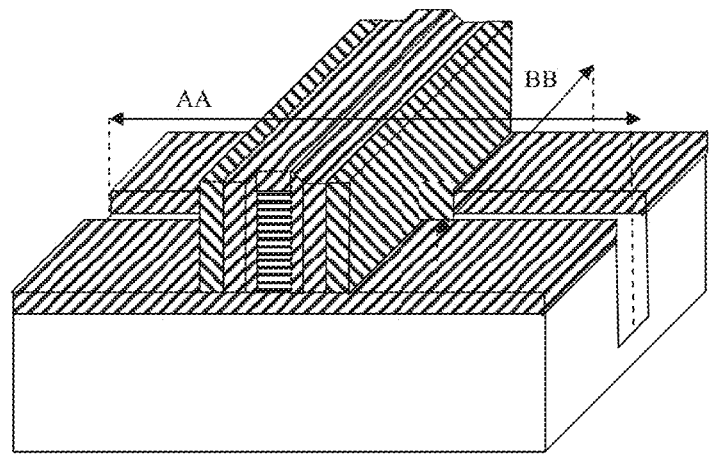
FIG. 10 is a schematic view of a structure of the device after performing an anisotropic dry etching process once again.
Figure 11:
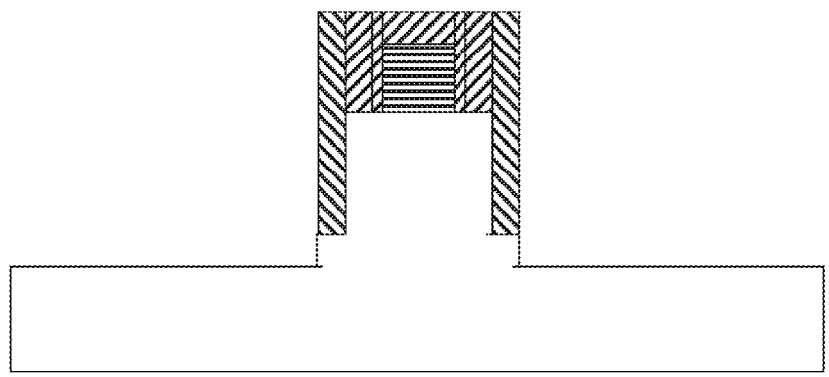
FIG. 11 is a cross-sectional view in an AA direction of the device in FIG. 10.
Figure 12:
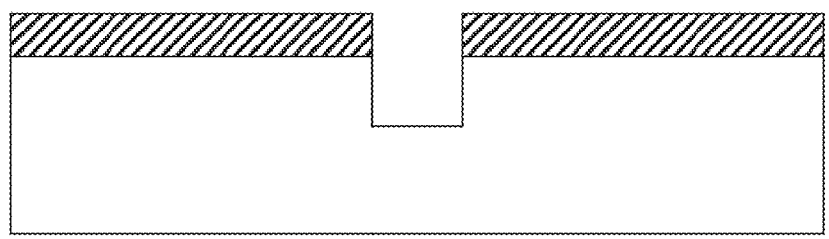
FIG. 12 is a cross-sectional view in a BB direction of the device in FIG. 10.

34. The silicon substrate of 100 Å is subjected to an anisotropic dry etching process once again, as shown in FIG. 10, where a cross-sectional view in AA direction is shown in FIG. 11 and a cross-sectional view in BB direction is shown in FIG. 12.

Figure 13:
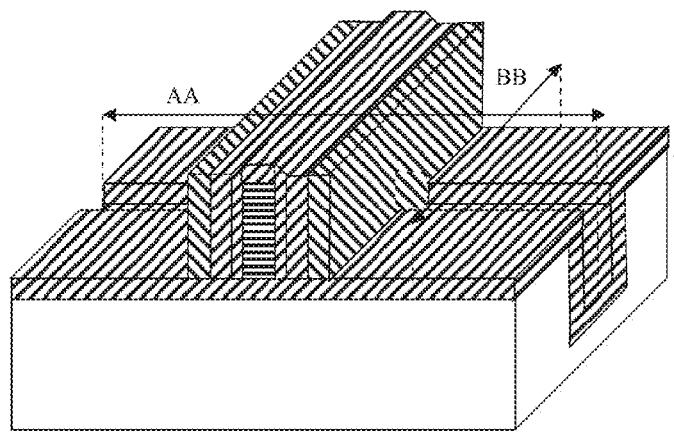
FIG. 13 is a schematic view of a structure of the device after a quasi-SOI structure is formed in the source and the drain by a wet oxidation process.
Figure 14:
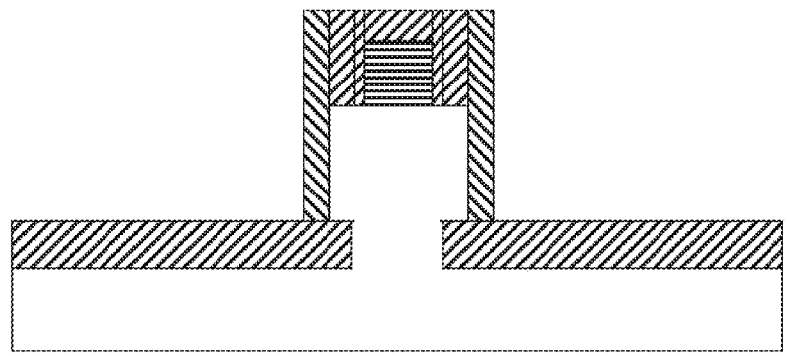
FIG. 14 is a cross-sectional view in an AA direction of the device in FIG. 13.
Figure 15:
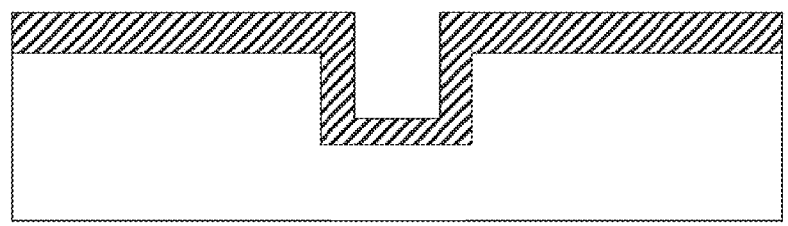
FIG. 15 is a cross-sectional view in a BB direction of the device in FIG. 13.

35. A silicon oxide layer of 200 Å is formed within the trench in the source and drain through a wet oxidation process, as shown in FIG. 13, where a cross-sectional view in AA direction is shown in FIG. 14 and a cross-sectional view in BB direction is shown in FIG. 15.

Figure 16:
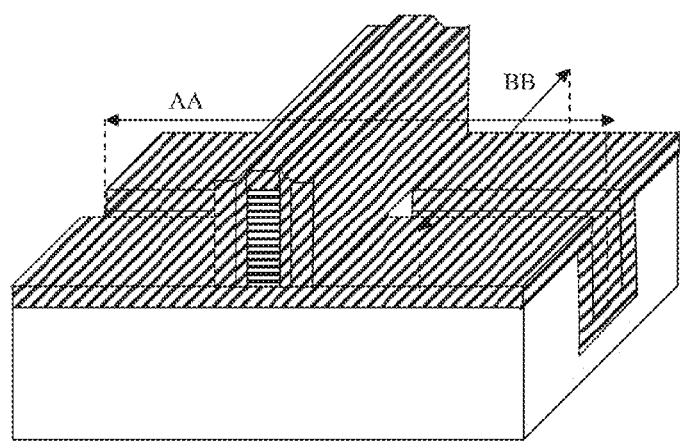
FIG. 16 is a schematic view of a structure of the device after the silicon nitride sidewalls are removed by a wet corrosion process.
Figure 17:
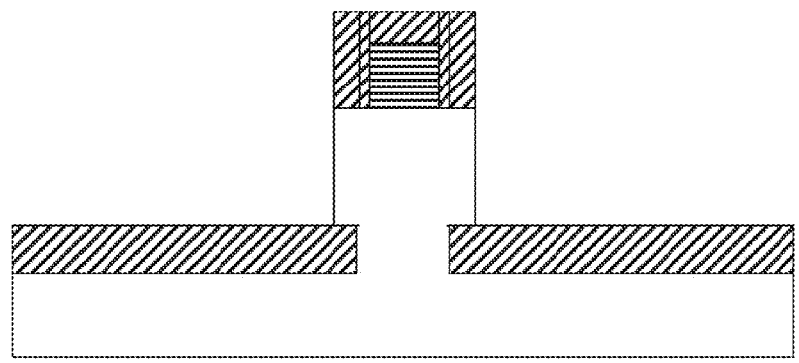
FIG. 17 is a cross-sectional view in an AA direction of the device in FIG. 16.
Figure 18:
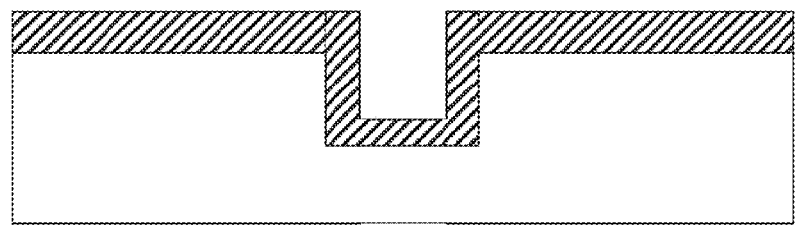
FIG. 18 is a cross-sectional view in a BB direction of the device in FIG. 16.

36. The silicon nitride layer of 150 Å is subjected to an isotropic wet corrosion process by using a hot phosphoric acid solution, as shown in FIG. 16, where a cross-sectional view in AA direction is shown in FIG. 17 and a cross-sectional view of FIG. 16 in BB direction is shown in FIG. 18.

Figure 19:
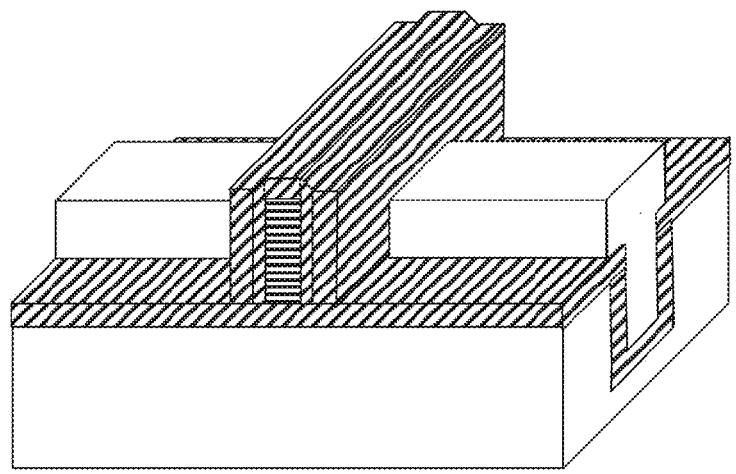
FIG. 19 is a schematic view of a structure of the device after an epitaxial monocrystalline silicon layer is formed as a lifted source and drain.

37. An epitaxial monocrystalline silicon layer is doped in situ to form a highly-doped lifted source and drain. An epitaxial thickness is 500 Å and a doping concentration is 1e20 cm$^{-3}$. A shape of the lifted source and drain formed of the epitaxial monocrystalline silicon are in connection with a crystal face of a silicon wafer and a crystal orientation of a channel. Herein, a device with a crystal orientation of <100> on a crystal face of (100) is taken as an example, as shown in FIG. 19.

38. An implantation with As for the source and drain is performed. The implantation energy is 10 keV; the implantation angle is 0 degree; and the implantation dosage is 2e15 cm$^{-2}$.

39. Impurities in the source and drain regions are activated. A laser annealing process is performed at a temperature of 1100 degrees for 1 ns.

40. A silicon oxide layer of 1000 Å is deposited through a low pressure chemical vapor deposition process to be used as a dielectric layer.

Figure 20:
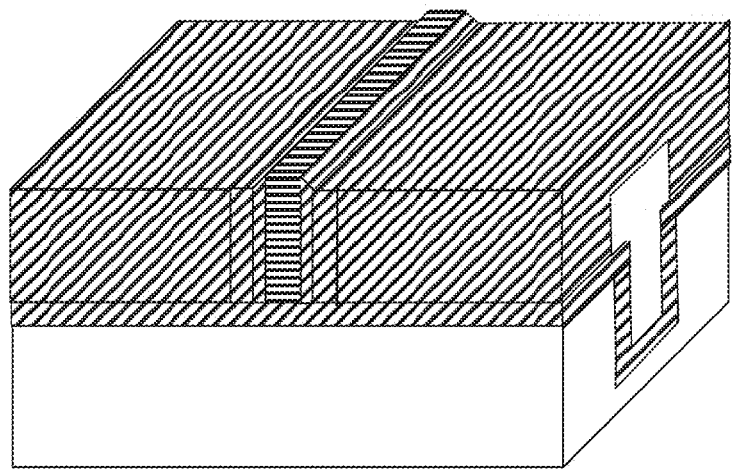
FIG. 20 is a schematic view of a structure of the device after a silicon oxide dielectric layer is subjected to a CMP process.

41. The silicon oxide layer is flattened by a CMP (chemical mechanical polishing) process until stopping at the polysilicon layer, as shown in FIG. 20.

42. The polysilicon layer of 400 Å is subjected to an isotropic wet corrosion process by using a TMAH solution.

43. The silicon oxide layer of 20 Å is subjected to an isotropic wet corrosion by using a HF solution.

44. A surface of the channel is highly-doped by using plasma impurity doping technology, silicon epitaxy in-situ doping technology or monomolecular layer doping technology. A dosage for the doping is 1e15 cm$^{-2}$.

45. A silicon oxide layer of 100 Å is deposited through an atomic layer deposition process.

46. Impurities in the channel region are activated by a laser annealing process at 1100 degrees for 1 ns.

47. The silicon oxide of 100 Å is subjected to an isotropic wet corrosion process by using a HF solution.

48. A silicon oxide layer of 8 Å is deposited through an atomic layer deposition process.

49. A hafnium oxide layer of 20 Å is deposited through an atomic layer deposition process.

50. A titanium nitride of 50 Å is deposited through an atomic layer deposition process.

Figure 21:
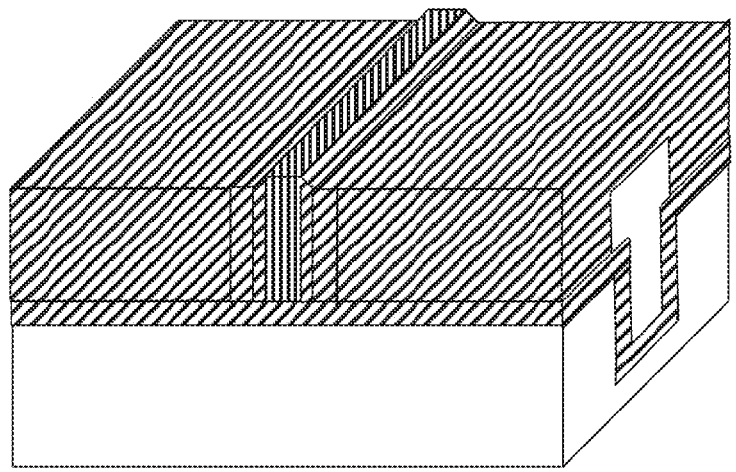
FIG. 21 is a schematic view of a structure of the device after a high-k metal gate is formed.
Figure 22:
FIG. 22 illustrates the materials used herein.
Figure 22:
Figure 22:
Figure 22:
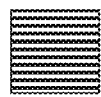
Figure 22:
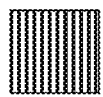

51. An aluminum layer of 500 Å is deposited through a physical sputtering process. The aluminum layer is flattened by a CMP (chemical mechanical polishing) process until stopping at the silicon oxide layer, as shown in FIG. 21.

52. Contact holes and metal contacts are formed at the source and drain.

53. An alloying process is performed.

The embodiments described above are not intended to limit the present invention. Any modifications and changes may be made by those skilled in the art without departing from the spirit and scope of the present invention. Therefore, the scope of the present invention is defined by the following claims.

What is claimed is:

1. A method for fabricating a multi-gate structure device with a source and a drain having a quasi-SOI structure, wherein the method comprises:
   forming an active region in a shape of a fin bar, comprising:
      depositing a silicon oxide layer and a silicon nitride layer on a surface of a silicon wafer to be used as materials for a hard mask;
      defining a pattern of the fin bar in a fine strip shape by a photolithography process;
      transferring the pattern onto the hard mask by using a dry etching process;
      transferring the pattern onto the silicon wafer by using the hard mask and removing a photoresist;
   forming an oxide isolation layer for shallow trench isolation (STI), comprising:
      depositing a silicon oxide layer as a material for STI;
      performing a CMP process to the silicon oxide layer until stopping at a surface of the silicon nitride layer, so that the surface of the silicon nitride layer and a surface of the silicon oxide layer are flattened;
      removing the silicon nitride layer used as the hard mask by using a wet corrosion process;
      etching back the silicon oxide layer in a region of STI by using a dry etching process so as to form STI;
      performing a well implantation process and a well annealing process; and
      performing an implantation process and an annealing process for inhibiting a substrate parasite transistor from being formed;
   forming a polysilicon dummy gate, comprising:
      forming a silicon oxide layer through a dry oxygen oxidation process to be used as a dummy gate dielectric layer;
      depositing a polysilicon layer as a gate material layer;
      performing a CMP process to flatten the polysilicon layer until stopping at a certain height from a top of the fin bar;
      depositing a silicon oxide layer as a hard mask layer for a gate line; and
      performing a photolithography process and an etching process to form a hard mask line and the gate line;
   forming source and drain extension regions, comprising:
      depositing a silicon oxide layer as an offset material layer;
      performing an implantation process for the source and drain extension regions; and
      depositing a silicon oxide layer and etching back it by using a dry etching process so as to form silicon oxide sidewalls;
   forming the source and the drain with the quasi-SOI structure, comprising:
      etching the silicon wafer in the source and the drain until stopping under a surface of the region of STI;
      depositing a silicon nitride layer and etching back it by using a dry etching process to form silicon nitride sidewalls, which are formed only at outer surfaces of the silicon oxide sidewalls, while the silicon nitride layer within a trench between regions of STI in the source and the drain is completely removed;
      etching the silicon wafer within the trench of the source and the drain once again to a certain depth by using an anisotropic dry etching process;
      forming a silicon oxide layer in the trench of the source and the drain through a wet oxidation process to be used as an isolation layer in the quasi-SOI structure;
      performing a wet corrosion process to remove the silicon nitride sidewalls;
      doping an epitaxial monocrystalline silicon layer in situ to form a highly-doped lifted source and drain; and
      performing an implantation process and an annealing process for the source and drain;
   forming a high-k metal gate, comprising:
      depositing a silicon oxide layer as a dielectric layer;
      performing a CMP process to the silicon oxide layer until stopping at the surface of the polysilicon layer, so that a surface of the silicon oxide layer and the surface of the polysilicon layer are flattened;
      removing the polysilicon dummy gate through a wet corrosion process;
      removing the dummy gate dielectric layer of silicon oxide through a wet corrosion process;
      forming a transition layer of silicon oxide and a high-k gate dielectric layer of HfO$_2$ through an atomic layer deposition process;
      forming a metal work function adjusting layer of TiN through an atomic layer deposition process;
      forming a metal gate material layer of Al through a physical vapor deposition process;
      performing a CMP process to the metal gate material layer of Al until stopping at the surface of the silicon oxide layer, so that the surface of the silicon oxide layer and a surface of Al are flattened;
      forming contact holes by using a photolithography process and an etching process; and
      forming metal contacts and performing an alloying process.

2. The method for fabricating the multi-gate structure device with the source and the drain having the quasi-SOI structure of claim 1, wherein in the step of depositing the materials for the hard mask, the silicon oxide layer has a thickness of about 200 Å and the silicon nitride layer has a thickness of about 500 Å.

3. The method for fabricating the multi-gate structure device with the source and the drain having the quasi-SOI structure of claim 1, wherein in the step of depositing a polysilicon layer as a gate material layer, the silicon oxide layer has a thickness more than about 1000 Å higher than a height of the fin bar.

4. The method for fabricating the multi-gate structure device with the source and the drain having the quasi-SOI structure of claim 1, wherein in the step of depositing a silicon oxide layer as a hard mask layer for a gate line, the silicon oxide layer has a thickness of about 300 Å.

5. The method for fabricating the multi-gate structure device with the source and the drain having the quasi-SOI structure of claim 1, wherein in the step of depositing a silicon oxide layer as an offset material layer, the silicon oxide layer has a thickness of about 50 Å.

6. The method for fabricating the multi-gate structure device with the source and the drain having the quasi-SOI structure of claim 1, wherein in the step of depositing and etching a silicon oxide layer to form silicon oxide sidewalls, the silicon oxide layer has a thickness of about 100 Å.

7. The method for fabricating the multi-gate structure device with the source and the drain having the quasi-SOI structure of claim 1, wherein in the step of depositing and etching a silicon nitride layer to form silicon nitride sidewalls, the silicon nitride layer has a thickness of about 150 Å.

8. The method for fabricating the multi-gate structure device with the source and the drain having the quasi-SOI structure of claim 1, wherein in the step of etching using an anisotropic dry etching process, the depth is 20-30 nm.

9. The method for fabricating the multi-gate structure device with the source and the drain having the quasi-SOI structure of claim 1, wherein in the step of depositing and etching a silicon oxide layer to form silicon oxide sidewalls, the silicon oxide layer has a thickness of about 4000 Å.

10. A method for fabricating a multi-gate structure device with a source and a drain having a quasi-SOI structure, wherein the method comprises:
   forming an active region in a shape of a fin bar, comprising:
      depositing a silicon oxide layer and a silicon nitride layer on a surface of a silicon wafer to be used as materials for a hard mask;
      defining a pattern of the fin bar in a fine strip shape by a photolithography process;
      transferring the pattern onto the hard mask by using a dry etching process;
      transferring the pattern onto the silicon wafer by using the hard mask and removing a photoresist;
   forming an oxide isolation layer for shallow trench isolation (STI), comprising:
      depositing a silicon oxide layer as a material for STI;
   forming a polysilicon dummy gate, comprising:
      forming a silicon oxide layer through a dry oxygen oxidation process to be used as a dummy gate dielectric layer;
      depositing a polysilicon layer as a gate material layer;
      performing a CMP process to flatten the polysilicon layer until stopping at a certain height from a top of the fin bar;
      depositing a silicon oxide layer as a hard mask layer for a gate line; and
      performing a photolithography process and an etching process to form a hard mask line and the gate line;
   forming source and drain extension regions, comprising:
      depositing a silicon oxide layer as an offset material layer;
      performing an implantation process for the source and drain extension regions; and
      depositing a silicon oxide layer and etching back it by using a dry etching process so as to form silicon oxide sidewalls;
   forming the source and the drain with the quasi-SOI structure, comprising:
      etching the silicon wafer in the source and the drain until stopping under a surface of the region of STI;
      depositing a silicon nitride layer and etching back it by using a dry etching process to form silicon nitride sidewalls, which are formed only at outer surfaces of the silicon oxide sidewalls, while the silicon nitride layer within a trench between regions of STI in the source and the drain is completely removed;
      etching the silicon wafer within the trench of the source and the drain once again to a certain depth by using an anisotropic dry etching process;
      forming a silicon oxide layer in the trench of the source and the drain through a wet oxidation process to be used as an isolation layer in the quasi-SOI structure;
      performing a wet corrosion process to remove the silicon nitride sidewalls;
      doping an epitaxial monocrystalline silicon layer in situ to form a highly-doped lifted source and drain; and
      performing an implantation process and an annealing process for the source and drain;
   forming a high-k metal gate.

11. The method of claim 10, wherein in the step of depositing the materials for the hard mask, the silicon oxide layer has a thickness of 200 Å and the silicon nitride layer has a thickness of about 500 Å.

12. The method of claim 11, wherein in the step of depositing a polysilicon layer as a gate material layer, the silicon oxide layer has a thickness more than about 1000 521 higher than a height of the fin bar.

13. The method of claim 12, wherein in the step of depositing a silicon oxide layer as a hard mask layer for a gate line, the silicon oxide layer has a thickness of about 300 Å.

14. The method of claim 13, wherein in the step of depositing a silicon oxide layer as an offset material layer, the silicon oxide layer has a thickness of about 50 Å.

15. The method of claim 14, wherein in the step of depositing and etching a silicon oxide layer to form silicon oxide sidewalls, the silicon oxide layer has a thickness of about 100 Å.

16. The method of claim 15, wherein in the step of depositing and etching a silicon nitride layer to form silicon nitride sidewalls, the silicon nitride layer has a thickness of 150 Å.

17. The method of claim 16, wherein in the step of etching using an anisotropic dry etching process, the depth is about 20 nm to about 30 nm.

18. The method of claim 10, wherein in the step of depositing and etching a silicon oxide layer to form silicon oxide sidewalls, the silicon oxide layer has a thickness of about 4000 Å.

19. The method of claim 10 wherein the step of forming the high-k metal gate comprises:
   depositing a silicon oxide layer as a dielectric layer;
   performing a CMP process to the silicon oxide layer until stopping at the surface of the polysilicon layer, so that a surface of the silicon oxide layer and the surface of the polysilicon layer are flattened;
   removing the polysilicon dummy gate through a wet corrosion process;
   removing the dummy gate dielectric layer of silicon oxide through a wet corrosion process;

forming a transition layer of silicon oxide and a high-k gate dielectric layer of $HfO_2$ through an atomic layer deposition process;

forming a metal work function adjusting layer of TiN through an atomic layer deposition process;

forming a metal gate material layer of Al through a physical vapor deposition process;

performing a CMP process to the metal gate material layer of Al until stopping at the surface of the silicon oxide layer, so that the surface of the silicon oxide layer and a surface of Al are flattened;

forming contact holes by using a photolithography process and an etching process; and forming metal contacts and performing an alloying process.

20. The method of claim 12, wherein in the step of depositing and etching a silicon nitride layer to form silicon nitride sidewalls, the silicon nitride layer has a thickness of 150 Å.

* * * * *